(12) United States Patent
Wang et al.

(10) Patent No.: US 9,299,928 B2
(45) Date of Patent: *Mar. 29, 2016

(54) NONVOLATILE MEMORY DEVICE HAVING A CURRENT LIMITING ELEMENT

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Imran Hashim, Saratoga, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/625,867

(22) Filed: Feb. 19, 2015

(65) Prior Publication Data

US 2015/0162530 A1 Jun. 11, 2015

Related U.S. Application Data

(63) Continuation of application No. 14/186,726, filed on Feb. 21, 2014, now Pat. No. 8,995,172, which is a continuation of application No. 13/353,000, filed on Jan. 18, 2012, now Pat. No. 8,681,530.

(60) Provisional application No. 61/513,355, filed on Jul. 29, 2011.

(51) Int. Cl.
*G11C 11/00* (2006.01)
*G11C 13/00* (2006.01)
*H01L 45/00* (2006.01)
*H01L 27/24* (2006.01)

(52) U.S. Cl.
CPC .......... *H01L 45/1253* (2013.01); *G11C 13/003* (2013.01); *G11C 13/0007* (2013.01);
(Continued)

(58) Field of Classification Search
CPC .................................................... G11C 13/0007
USPC ......................................................... 365/148
See application file for complete search history.

(56) References Cited

U.S. PATENT DOCUMENTS

| 8,410,467 B2* | 4/2013 | Wada | G11C 13/0007 257/2 |
| 8,995,172 B2* | 3/2015 | Wang | G11C 13/0007 365/148 |
| 2009/0039332 A1* | 2/2009 | Lee | H01L 45/04 257/4 |

*Primary Examiner* — Son Mai

(57) ABSTRACT

Embodiments of the invention generally include a method of forming a nonvolatile memory device that contains a resistive switching memory element that has an improved device switching performance and lifetime, due to the addition of a current limiting component disposed therein. In one embodiment, the current limiting component comprises at least one layer of resistive material that is configured to improve the switching performance and lifetime of the formed resistive switching memory element. The electrical properties of the formed current limiting layer, or resistive layer, are configured to lower the current flow through the variable resistance layer during the logic state programming steps (i.e., "set" and "reset" steps) by adding a fixed series resistance in the formed resistive switching memory element found in the nonvolatile memory device. Typically, resistive switching memory elements may be formed as part of a high-capacity nonvolatile memory integrated circuit, which can be used in various electronic devices, such as digital cameras, mobile telephones, handheld computers, and music players.

17 Claims, 9 Drawing Sheets

(52) U.S. Cl.
CPC ........ *H01L27/2409* (2013.01); *H01L 27/2436* (2013.01); *H01L 27/2463* (2013.01); *H01L 45/08* (2013.01); *H01L 45/12* (2013.01); *H01L 45/1233* (2013.01); *H01L 45/145* (2013.01); *H01L 45/146* (2013.01); *H01L 45/148* (2013.01); *H01L 45/1616* (2013.01); *G11C 2213/56* (2013.01); *G11C 2213/76* (2013.01)

NONVOLATILE MEMORY DEVICE HAVING A CURRENT LIMITING ELEMENT

CROSS-REFERENCE TO RELATED APPLICATIONS

This application is a continuation claiming priority to U.S. patent application Ser. No. 14/186,726 filed Feb. 21, 2014, which is a continuation claiming priority to U.S. patent application Ser. No. 13/353,000 filed Jan. 18, 2012 (issued as U.S. Pat. No. 8,681,530), which claims priority to U.S. Prov. Pat. App. Ser. No. 61/513,355 filed Jul. 29, 2011, each of which is entirely incorporated by reference herein for all purposes.

BACKGROUND

1. Field of the Invention

This invention relates to nonvolatile memory elements, and more particularly, to methods for forming resistive switching memory elements used in nonvolatile memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide (MO) films has been demonstrated. Although metal oxide (MO) films such as these exhibit bistability, the resistance of these films and/or the ratio of the high-to-low resistance states is (are) often insufficient to be of use within a practical nonvolatile memory device. For instance, the resistance states of the metal oxide film should preferably be significant as compared to that of the system (e.g., the memory device and associated circuitry) so that any change in the resistance state change is perceptible. Since the variation in the difference in the resistive states is related to the resistance of the resistive switching layer, it is often hard to use a low resistance metal oxide film to form a reliable nonvolatile memory device. For example, in a nonvolatile memory that has conductive lines formed of a relatively high resistance metal such as tungsten, the resistance of the conductive lines may overwhelm the resistance of the metal oxide resistive switching element if its resistance was not sufficiently high. This may make it difficult or impossible to sense the state of the bistable metal oxide resistive switching element. Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (i.e., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably "set", "reset" and/or determine the desired "on" and "off" states of the device to minimize overall power consumption of the memory chip as well as resistive heating of the device and cross-talk between adjacent devices.

Moreover, as nonvolatile memory device sizes shrink it becomes increasing necessary to assure that the "set" and "reset" currents used to change the state of the memory element are not too large so as to require higher voltage transistors for chip control circuitry, as well as to minimize damage to or alter the electrical or physical properties of the one or more layers found in the formed memory device. A large current flowing through the current carrying lines in a memory array can also undesirably alter or disturb the memory state of other interconnected devices or possibly damage portions of the adjacently connected devices, due to an appreciable amount of "cross-talk" created between them due to resistive heat transfer.

Therefore, there is a need to limit and/or minimize the required current used to sense and program the logic states of each of the interconnected devices in an effort to reduce chip overall power consumption as well as improve device longevity and reduce the chance that cross-talk between adjacently connected devices. Therefore, it is desirable to form a nonvolatile memory device that requires low programming currents to change the device between the "on" and "off" states.

SUMMARY

Embodiments of the invention generally relate to a resistive switching nonvolatile memory device having an interface layer structure disposed between at least one of the electrodes and a variable resistance layer formed in the nonvolatile memory device. The resistive switching memory elements may be formed as part of a high-capacity nonvolatile memory integrated circuit, which can be used in various electronic devices, such as digital cameras, mobile telephones, handheld computers, and music players. The resistive switching nonvolatile memory device, comprises a passivation region, an interface coupling region, and/or a variable resistance layer interface region that are configured to adjust the nonvolatile memory device's performance, such as lowering the formed device's switching currents and reducing the device's forming voltage, and reducing the performance variation from one formed device to another.

The present invention may provide a nonvolatile memory element, comprising a first electrode layer, a second electrode layer, a variable resistance layer disposed between the first electrode layer and the second electrode layer, wherein the magnitude of an electrical resistance of the variable resistance layer is decreased by at least 5 times from a high resistance value compared to the low resistance value when a first current is delivered through the variable resistance layer when a first voltage is applied across the first and second electrodes, and the magnitude of an electrical resistance of the variable resistance layer is not significantly changed from the high resistance value when a current less than the first current is delivered through the variable resistance layer, a resistive layer disposed between the first electrode layer and the variable resistance layer and a current steering device disposed between the first electrode layer and the second electrode layer, wherein the current steering device has a device resistance and preferentially allows current to flow between the first electrode layer and the second electrode layer, and wherein the electrical resistance of the resistive layer is greater than zero and less than the first voltage divided by the first current minus the device resistance of the current steering device Embodiments of the present invention may further provide a method of forming a nonvolatile memory element, comprising forming a first electrode layer over a surface of a substrate, forming a second electrode layer over the surface of the substrate, forming a variable resistance layer comprising a variable resistance material, wherein the variable resistance layer is disposed between the first and second electrode layers, wherein the magnitude of an electrical resistance of the variable resistance layer is decreased by at least 5 times from a high resistance compared to the low resistance state value when a first current is delivered through the variable resistance layer when a first voltage is applied across the first and second electrodes, and the magnitude of an electrical resistance of the variable resistance layer is not significantly changed from the high resistance value when a current less than the first current is delivered through the variable resistance layer, forming a current steering device over the surface of the substrate, and between the first and second electrode layers, wherein the current steering device has a device resistance and preferentially allows current to flow between the first electrode layer and the second electrode layer, and forming a resistive layer comprising a resistive layer material over the surface of the substrate, and between the first and second electrode layers, wherein forming the resistive layer further comprises adjusting the resistivity of the resistive layer material and/or the thickness of the resistive layer so that the electrical resistance of the resistive layer is greater than zero and less than the first voltage divided by the first current minus the device resistance of the current steering device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

While the foregoing is directed to embodiments of the present invention, other and further embodiments of the invention may be devised without departing from the basic scope thereof, and the scope thereof is determined by the claims that follow.

DETAILED DESCRIPTION

Embodiments of the invention generally include a method of forming a nonvolatile memory device that contains a resistive switching memory element that has an improved device switching performance and increased usable lifetime, due to the addition of a current limiting component disposed therein. In one embodiment, the current limiting component comprises at least one layer of a resistive material that is disposed within a formed resistive switching memory element in a nonvolatile resistive switching memory device. The electrical properties of the formed current limiting layer, or resistive layer, are configured to lower the current flow through the variable resistance layer by adding a fixed series resistance in the formed nonvolatile resistive switching memory device. It is generally desirable to form the resistive layer so that its material and electrical properties will not degrade or breakdown during the often high current "burn-in" type device preparation steps, such as the "electrical forming" process, and also during normal repetitive operation of the nonvolatile resistive switching memory device. Typically, nonvolatile resistive switching memory devices may be formed as part of a high-capacity nonvolatile memory integrated circuit, which can be used in various electronic devices, such as digital cameras, mobile telephones, handheld computers, and music players.

Figure 1:
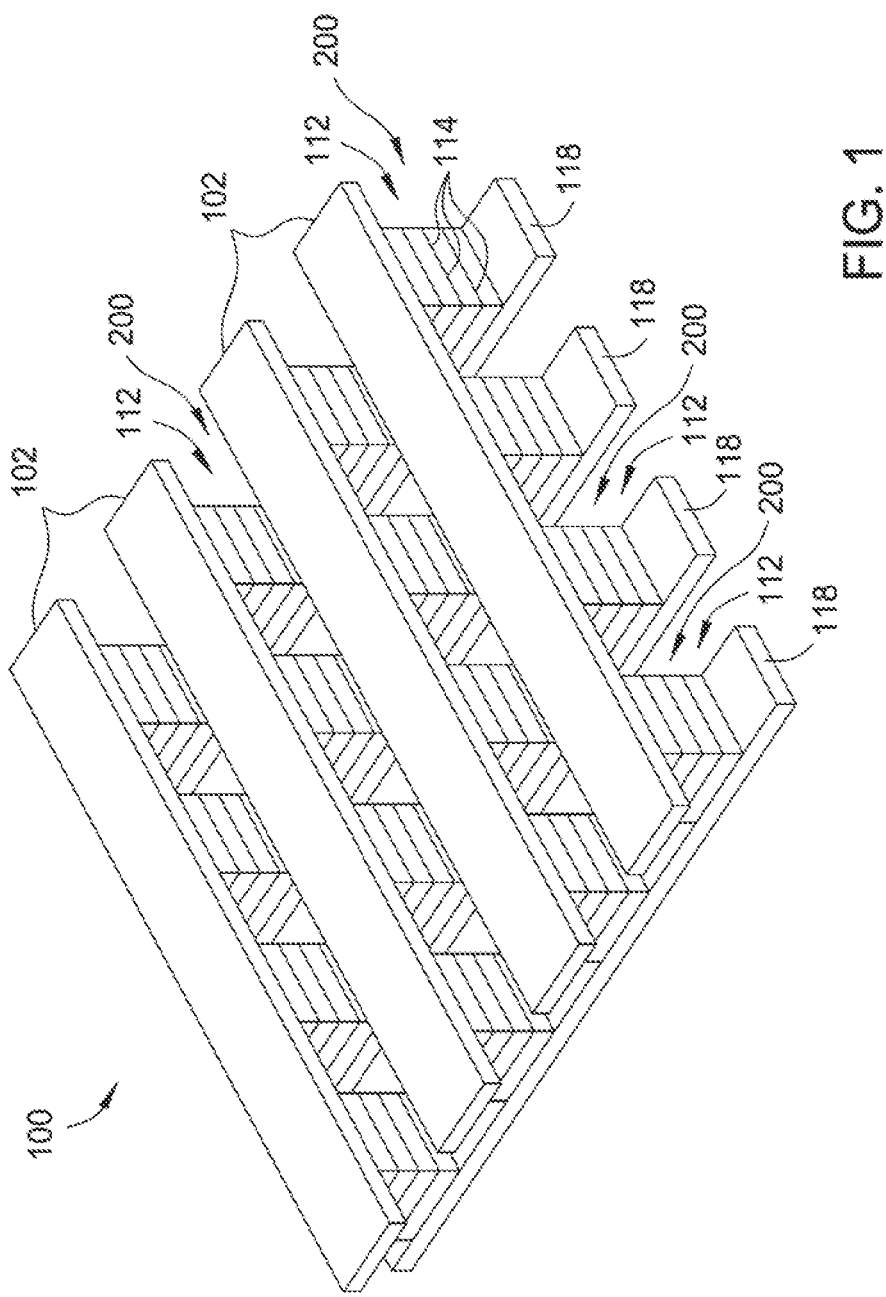
FIG. 1 illustrates an array of resistive switching memory elements in accordance with an embodiment of the invention.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and orthogonal bit-lines, which are referred to herein generally as electrodes 102 and 118, and are used to read from or write data into the memory element 200. Electrodes 102 and 118, generally include one or more conductive layers that each have a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figure 2A:
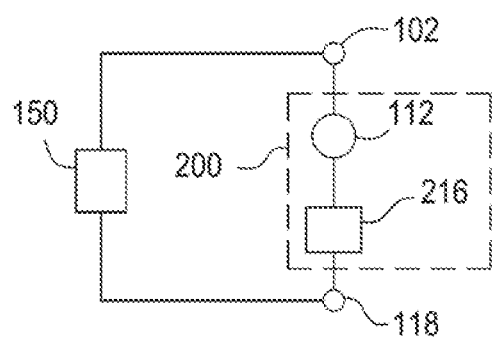
FIG. 2A is schematic representation of a memory device in accordance with an embodiment of the invention.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112 when that memory element is not selected to read.

Figure 2B:
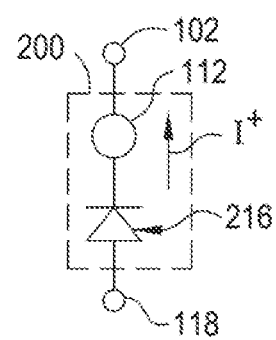
FIG. 2B is schematic representation of a memory device having a diode type current steering element in accordance with an embodiment of the invention.

FIG. 2B schematically illustrates a switching memory device 200 that contains a memory element 112 and a diode type current steering device 216 that preferentially allows, or said another way minimally inhibits, current to flow through the memory device 200 in a forward direction ("I+"). However, due to the design of the current steering device 216, a reduced current can also flow in the opposing direction through the device by the application of a reverse bias to the electrodes 102 and 118.

Figure 2C:
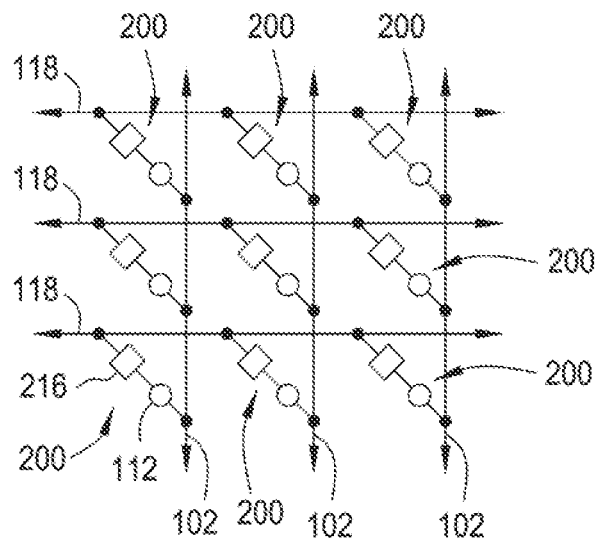
FIG. 2C is schematic representation of an array of memory devices in accordance with an embodiment of the invention.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 are formed.

Figure 2D:
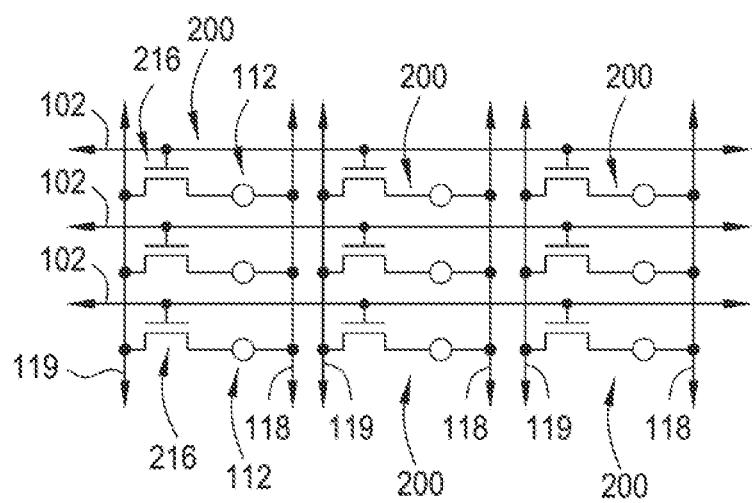
FIG. 2D is schematic representation of an array of memory devices in accordance with an embodiment of the invention.

FIG. 2D schematically illustrates another embodiment of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 are formed.

During operation, such as a read operation, the state of a memory element 112 in the switching memory device 200 can be sensed by applying a sensing voltage (i.e., a "read" voltage $V_{READ}$ (FIG. 4A)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118.

In some embodiments, the memory element 112 uses bipolar switching where opposite polarity set and "reset" voltages are used to alter the resistance of the memory element between high and low resistance states. FIG. 4A schematically illustrates a log-log plot of current (I) versus voltage (V) of one example of the low-resistance-state (LRS) and high-resistant-state (HRS) curves of a memory element 112 having these two bistable resistive states. The voltage levels $V_{SET}$ and $V_{RESET}$, shown in FIG. 4A, illustrate typical threshold values used to "set" and "reset" the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a "set" voltage $V_{SET}$ (e.g., −1 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated"), or defects, in the resistive switching layer, or variable resistance layer 206 (FIG. 3A or 5A), when the device is reverse biased. The variable resistance layer 206, or bistable resistance layer, which is disposed in the memory element 112, will generally have at least two bistable resistive states (e.g., low-resistance-state (LRS), high-resistant-state (HRS)). It is believed that the defects or traps, which are commonly formed during the deposition or initial burn-in or forming of the variable resistance layer 206, are often created by a non-stoichiometric material composition found in the formed variable resistance layer 206. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive "reset" voltage $V_{RESET}$ (e.g., +1 V to +5 V) to memory element 112. When read and write circuitry applies $V_{RESET}$ to memory element 112, memory element 112 enters its high resistance state. When the "reset" voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the "set" and "reset" voltages have the same polarity, without deviating from the scope of the invention described herein.

To provide a measurable difference between the logic "zero" and logic "one" states is common to form the variable resistance layer 206 and other memory element 112 components so that the $I_{ON}$ and $I_{OFF}$ currents have a difference of at least five times (e.g., current ratio $I_{ON}/I_{OFF} \geq 5$). In one example, difference between the logic "zero" and logic "one" states is at least one order of magnitude (e.g., current ratio $I_{ON}/I_{OFF} \geq 10$). In other words, the ratio of the electrical resistances of the variable resistance layer 206 is decreased by at least a factor of 5 to 10 when switching from the high to the low resistance state. For example, the electrical resistance of the variable resistance layer 206 in the high resistance state is at least 5 to 10 times greater than the electrical resistance of the low resistance state when applying a $V_{READ}$ read voltage across electrodes 102 and 118 in the device.

In an effort to prepare the memory element 112 for use, it is common to apply a forming voltage ($V_{FORM}$) at least once across the electrodes 102, 118 to "burn-in" the device. It is believed that the application of a forming voltage, which is typically significantly greater than the $V_{RESET}$ and $V_{SET}$ voltages, causes the defects that are formed within the variable resistance layer 206 during the device fabrication process to move, align and/or collect within various regions of the formed layer, causing the variable resistance layer 206 to consistently and reliably switch between the "on" and "off" resistive states throughout the memory element's life. In one configuration, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required at all to assure that the device will perform as desired throughout its life.

Figure 3B:
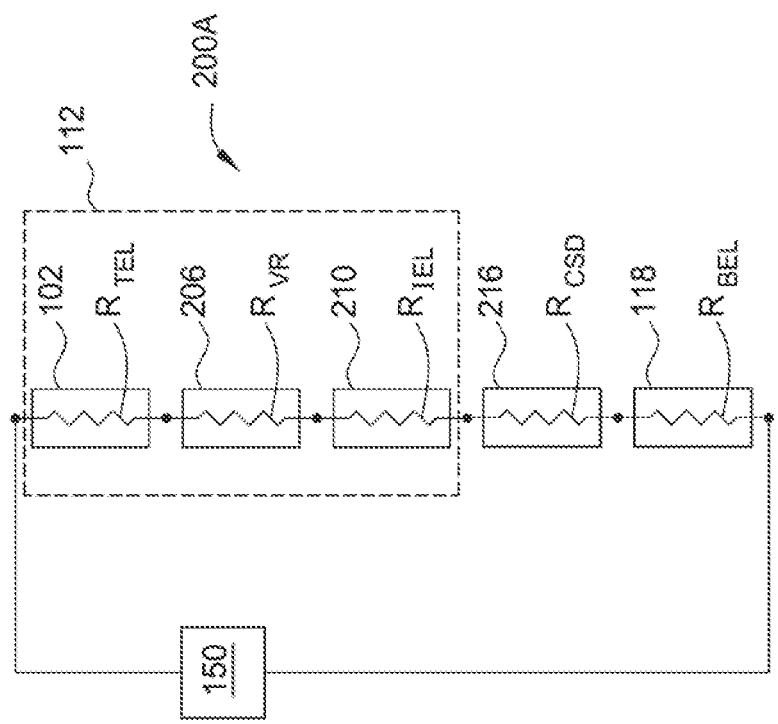
FIG. 3B is a schematic representation of an electrical circuit formed in the standard memory element illustrated in FIG. 3A.
Figure 3A:
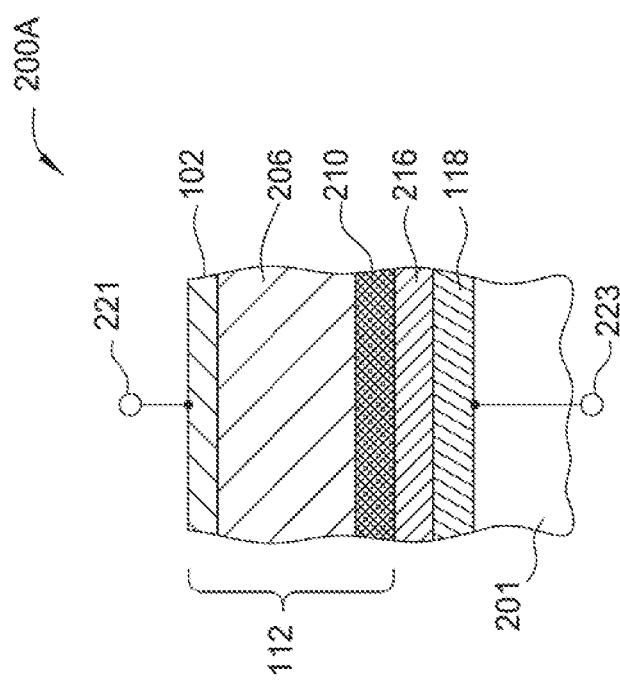
FIG. 3A is a schematic side cross-sectional view of a standard memory element disposed in a nonvolatile memory device.
Figure 4A:
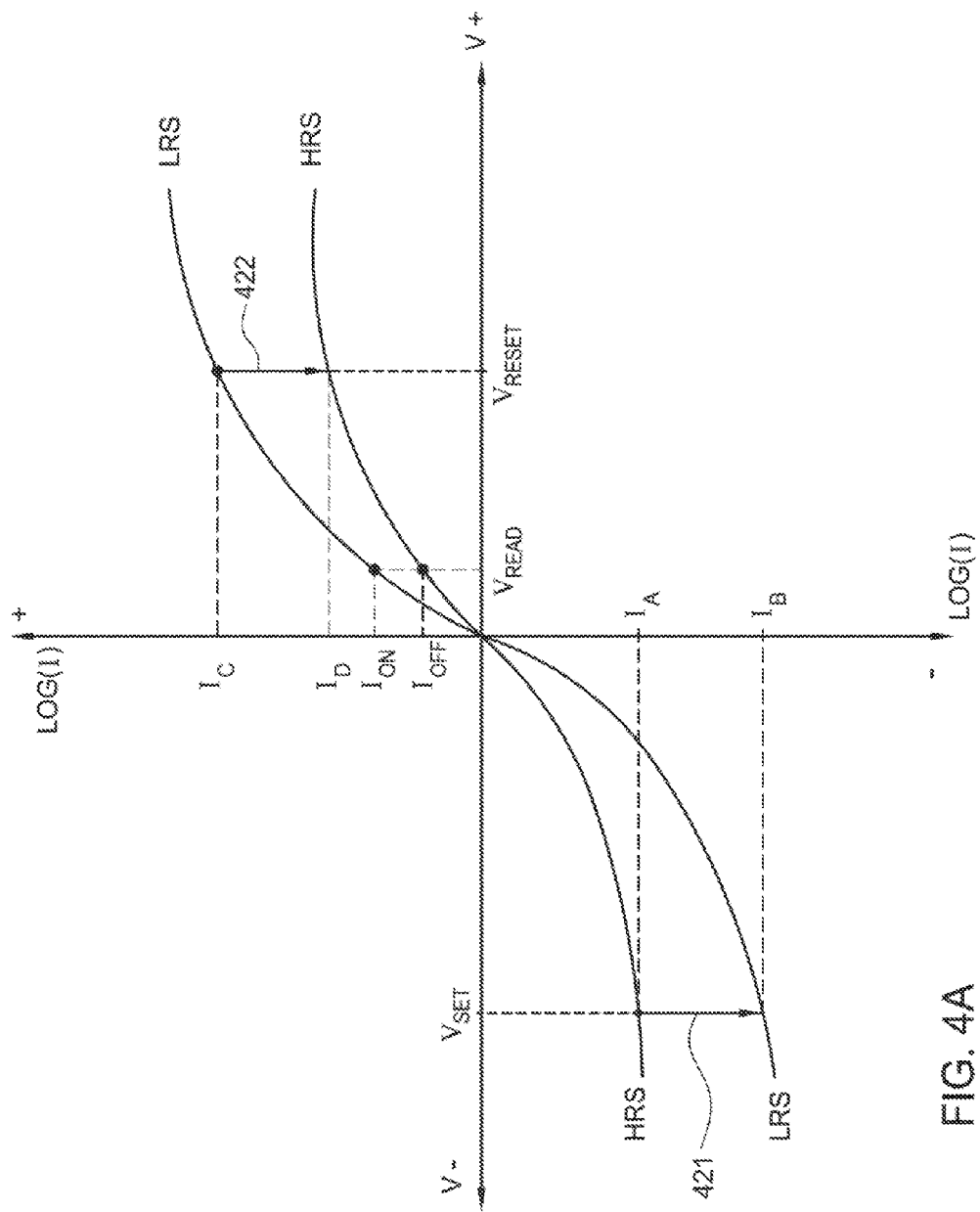
FIG. 4A is a graph illustrating the current (I) versus voltage (V) characteristics of the high and low resistance I-V curves of a variable resistance layer in accordance with an embodiment of the invention.

FIG. 3A is a schematic side cross-sectional view of a standard un-optimized switching memory device 200A, which contains a memory element 112 and a current steering device 216 (e.g., diode) that is formed over a substrate 201. In this configuration, the memory element 112 generally contains a top electrode 102, variable resistance layer 206 and intermediate electrode 210. FIG. 3B schematically illustrates an electrical circuit formed in the switching memory device 200A shown in FIG. 3A. As illustrated in FIG. 3B, the electrical circuit within the standard switching memory device 200A includes a top electrode impedance (i.e., resistance $R_{TEL}$) created by the material layer(s) in the top electrode 102, a variable resistance layer impedance (i.e., resistance $R_{VR}$) created by the material layer(s) in the variable resistance layer 206, an intermediate electrode impedance (i.e., resistance $R_{IEL}$) created by the material layer(s) in the intermediate electrode 210, a current steering device impedance (i.e., resistance $R_{CSD}$) created by the material layer(s) in the current steering device 216 and a bottom electrode impedance (i.e., resistance $R_{BEL}$) created by the material layer(s) in the bottom electrode 118. The electrodes 102, 210 and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The variable resistance layer 206 can be a dielectric material, such as a metal oxide material or other similar material that can be switched between at least two or more stable resistive states. One will note that it is assumed that the contact resistances between the various layers in the switching memory device, such as the contact resistance formed between the electrode 102 and the variable resistance layer 206, are negligible to help reduce the complexity of the discussion of the circuit. While the current steering device 216 may include two or more layers of semiconductor material that are adapted to control the flow of current through the formed memory device 200A, the resistance of each of the components in the current steering device 216 are not individually discussed herein to minimize the complexity of the discussion, and thus an overall current steering device resistance $R_{CSD}$ is used to represent the overall impedance of the current steering device 216.

As noted above, FIG. 4A schematically illustrates a log-log plot of current (I) versus voltage (V) of the low-resistance-state (LRS) and high-resistant-state (HRS) curves, or load lines, of a memory element 112 having these two bistable resistive states. As illustrated in FIG. 4A, by sweeping the voltage applied to the electrodes 102 and 118 between the $V_{SET}$ (e.g., −3 volts) and $V_{RESET}$ (e.g., +4 volts), while the device is in the low resistance state, the LRS curve can be created, and by sweeping the voltage applied to the electrodes 102 and 118 between the $V_{SET}$ and $V_{RESET}$, while the device is in the high resistance state, the HRS curve can be created. As noted above, depending on the physical and electrical characteristics of a formed variable resistance layer 206, it will switch from the HRS to the LRS during a "set" operation when a $V_{SET}$ is applied, and the variable resistance layer 206 will switch from the LRS to the HRS during a "reset" operation when a $V_{RESET}$ is applied.

Figure 4B:
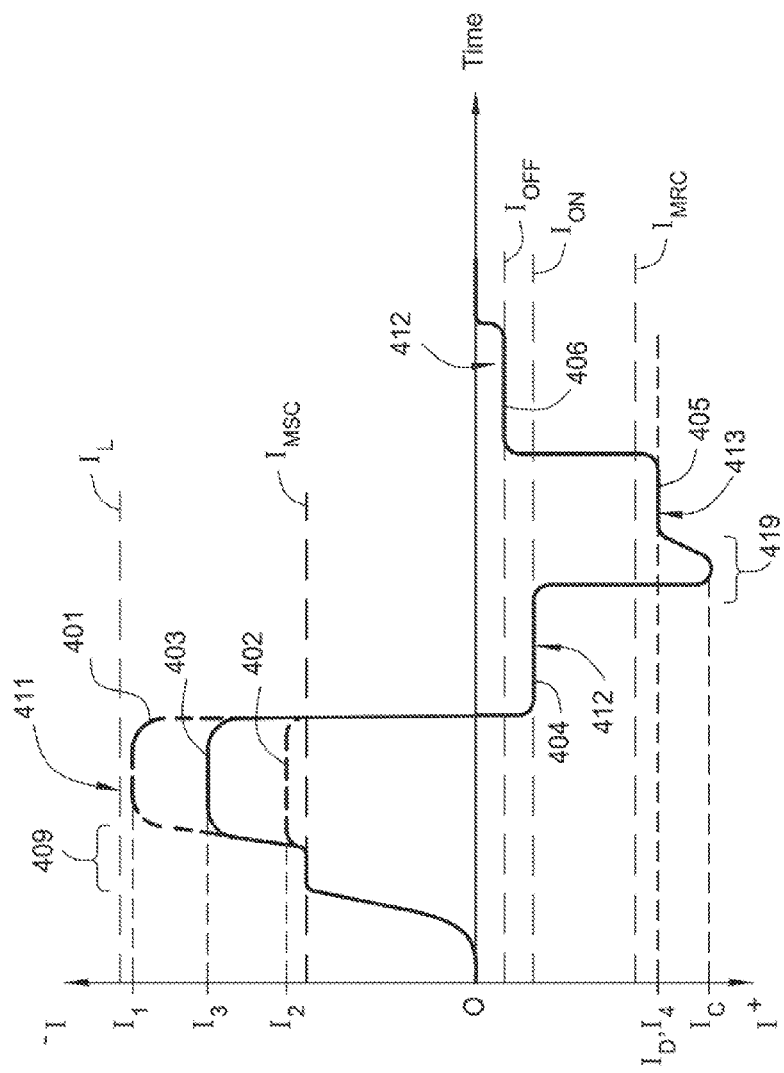
FIG. 4B is a current versus time plot illustrating the effect of delivering bipolar type switching pulses through a memory element in accordance with an embodiment of the invention.

FIG. 4B is a plot of current versus time for a plurality of bipolar type "set" and "reset" switching pulses, as illustrated by pulses 401-406, that are delivered to a switching memory device in accordance with an embodiment of the invention. In one example, as shown in FIG. 4B, a device programming step may include the delivery of a "set" switching pulse 411, a "reset" switching pulse 413, and two "sensing" pulses 412. To assure that the memory element 112 reliably switches from a high resistance state (HRS) to a low resistance state (LRS) and vice versa, one must assure that the "set" switching pulse 411 produces a current that is greater than a minimum "set" current $I_{MSC}$, which is defined as the minimum current required to flow through the variable resistance layer 206 to cause it to switch from a high resistance state (e.g., 2.5 MΩ) to a low resistance state (e.g., <<250 kΩ). In one example, the high and low resistance states of the variable resistance layer 206 may be about 2.5 MΩ and about 100 kΩ, respectively.

Similarly, to assure that the memory element 112 reliably switches from a low to a high resistance state the "reset" switching pulse 413 will generally be delivered at a current level that is greater than a minimum "reset" current $I_{MRC}$, which is defined as the minimum current required to flow through the variable resistance layer 206 to cause it to switch from a low resistance state to a high resistance state. It should be noted that the minimum "set" current $I_{MSC}$ and minimum "reset" current $I_{MRC}$ are related to the physical and/or electrical properties of the material in the variable resistance layer 206, and thus may be adjusted by careful selection of the material(s) and/or physical properties (e.g., thickness) of the variable resistance layer 206 and by performing various post-processing steps on the formed layer. In one example, by controlling the number of defects in the formed variable resistance layer 206, such as by adjusting the stoichiometry of the material(s) found in the variable resistance layer 206 (e.g., $HfO_{1.7}$ VS. $HfO_2$) during the layer formation process, the minimum switching currents can be adjusted.

Referring to FIG. 4A, in one example, when a "set" switching pulse 411 is delivered through the standard switching memory device 200A the switching memory device will switch from the high-resistance-state (HRS) to the low-resistance-state (LRS), as shown by the arrow 421. One will note that the current flowing through the switching memory device will shift from the initial "set" current $I_A$ to the final "set" current $I_B$ during the "set" operation, due to the change in resistance ($R_{VR}$) of the variable resistance layer 206. One will note that the initial "set" current $I_A$ will typically equal the minimum "set" current $I_{MSD}$, which is discussed above.

Alternately, when a "reset" switching pulse 413 is delivered through the standard switching memory device 200A the switching memory device will switch from the low-resistance-state (LRS) to the high-resistance-state (HRS), as shown by the arrow 422. One will note that the current flowing through the switching memory device will shift from the initial "reset" current $I_C$ to the final "reset" current $I_D$ during the "reset" operation, due to the change in resistance ($R_{VR}$) of the variable resistance layer 206.

Referring to FIG. 4B, in one example, a "set" switching pulse 411, such as switching pulse 401, is delivered through the standard switching memory device 200A to create a low resistance state or logic "one" state. In this case, a "set" voltage $V_{SET}$ is applied across electrodes 102 and 118, which creates a first "set" current $I_1$ to flow through the standard switching memory device 200A, due to the impedance of the electrical components found in the memory element 200A. The first "set" current $I_1$ is equal to the applied "set" voltage $V_{SET}$ divided by the sum of the impedances of the standard switching memory device 200A. Therefore, in one example, the first "set" current $I_1$ may equal the following.

$$I_1 = V_{SET}/(R_{TEL}+R_{VR}+R_{IEL}+R_{CSD}+R_{BEL}).$$

Since the most damage to the elements contained in the standard switching memory device 200A will generally occur when the largest current is delivered through the switching memory device, the pulse 411 schematically illustrated in FIG. 4B focuses on the later stages of the "set" operation, and thus the first "set" current $I_1$ achieved during the later stages of the "set" switching pulse 411 will generally equal the final "set" current $I_B$. In general, the first "set" current $I_1$ will vary during the time that the "set" pulse 411 is applied across the electrodes 102 and 118. The first "set" current $I_1$ may have low current region 409 that is created due to the electrical properties of the material as it switches from the HRS to the LRS, and also have the final "set" current region as discussed above. Therefore, since the actual impedance of the electrodes is generally small, due to the need to reduce the power loss in the device, and the impedance of the variable resistive layer 206 is desirably low at the end of the "set" operation (e.g., $I_1=I_B$) to achieve a logic "one" state the impedance of the current steering device will dominate the circuit (e.g., $R_{CSD} >> R_{TEL}+R_{IEL}+R_{BEL}+R_{VR}$) and the impedance of the circuit in this state is approximately equal to the impedance of the current steering device (i.e., $R_{CSD}$). Therefore, the magnitude of the "set" current $I_1$ created by the switching pulse 401 will equal the maximum current, or load current $I_L$ (FIG. 4B), which is approximately equal to the "set" voltage divided by the impedance of the current steering device (i.e., $I_1=I_L=\sim V_{SET}/R_{CSD}$). One will note that the difference between the "set" current $I_1$ and the minimum $I_{MSC}$ current is much larger than necessary to cause the device to reliably switch to the logic "one" state. However, in practice it has been found that the high currents delivered through a standard type switching memory device 200A can permanently damage the memory element components and cause cross-talk to occur between adjacently connected devices. One will note that the magnitude of the "set" current is particularly important for bipolar switching applications that require the current steering element 216 to be reverse biased to "set" the resistance of the memory element into a low resistance state. In this case, the act of driving a high current through the current steering device 216, in a non-forward direction, can breakdown, generate heat within and ultimately damage the material layers used to form the current steering element 216 and memory element 112, which will reduce the current steering element's and/or memory element's effective lifetime. It has been found that, since the current steering device 216 provides the primary voltage drop in the standard switching memory device 200A during the "set" operation (e.g., switch to "on" state), the current steering device 216 often is required to operate near its breakdown voltage to reliably cause the variable resistance layer 206 to switch. The application of the current steering device 216 in this regime will cause its impedance to drop over time due to damage to the materials in the formed layer. Typically the resistance ($R_{CSD}$) of an undamaged reverse biased diode type current steering device, for example, may be in a range between about 1 and about 100 mega-ohms (MΩ), while the resistance of a forward biased diode type current steering device may be between about 1 and about 20 kilo-ohms (kΩ).

Therefore, after performing the "set" operation by applying the "set" switching pulse 411, it is common to apply a "sensing" pulse 412 to assure that the logic "one" state has been achieved. The application of a sensing pulse 412, such as sensing pulse 404 in FIG. 4B, is generally performed by applying a $V_{READ}$ voltage (e.g., +0.5V) across the electrodes 102, 118. If the "set" operation was performed correctly, the current through a standard switching memory device 200A during this sensing step will equal the $I_{ON}$ current, which equals the $V_{READ}$ voltage divided by the impedance of the circuit. For a standard switching memory device 200A that has a variable resistance layer 206 that is in a low resistance state, the $I_{ON}$ current will approximately equal to the $V_{READ}$ voltage divided by the impedance of the current steering device (e.g., $I_{ON} = \sim V_{READ}/R_{CSD}$).

Next, in cases where it desirable to change the memory element 112 from a low resistance state (i.e., logic "one" state) to a high resistance state (i.e., logic "zero" state) a "reset" switching pulse 413, such as "reset" switching pulse 405, is delivered through the standard switching memory device 200A. One will note that the largest current that is delivered through the switching memory device during the "reset" operation will be achieved when the initial "reset" current $I_C$ flows through the device. The current flowing through the device during the "reset" operation will then tend to drop as the variable resistive layer 206 switches from a LRS to a HRS. Therefore, the pulse 413, which is schematically illustrated in FIG. 4B, may have a high current portion 419 at the start of the delivered pulse 413 and a stable region that equals the "reset" current $I_4$ during the later stages of the "reset" operation. Therefore, the "reset" current $I_4$ achieved during for most of duration of the "reset" switching pulse 413 will equal the final "reset" current $I_D$ and the maximum current achieved during the pulse 413 will equal the initial "reset" current $I_C$. It has been found that the magnitude of the current required to switch the memory element 112 to a high resistance state (HRS) from a low resistance state (LRS) is dependent on the magnitude of the current used to "set" the device in the low resistance state. If a high "set" current, such as current $I_1$, is delivered to the memory element 112, then a higher "reset" current is required to achieve a desirable high resistance state. Stated another way, the difference between the initial "reset" current $I_C$, and/or the final "reset" current $I_D$, and the minimum "reset" current $I_{MRC}$ current needs to be larger than necessary to cause the device to switch from the "on" to the "off" state if the magnitude of the prior applied "set" current is too far from the minimum "set" current $I_{MSC}$. The larger than necessary swings in the current used to switch between the "on" and "off" states can damage the materials and components in the switching memory device, thus affecting the memory element's lifetime and reliability.

Next, after delivering the "reset" switching pulse 413 it is common to apply a "sensing" pulse 412, such as sensing pulse 406 in FIG. 4B, to assure that the logic "zero" state has been achieved. The sensing pulse 412 is generally performed by applying a $V_{READ}$ voltage (e.g., +0.5V) across the electrodes 102, 118. If a "reset" operation was performed correctly, the current through a standard switching memory device 200A during this sensing step will equal the $I_{OFF}$ current, which for the standard switching memory device 200A will equal to the $V_{READ}$ voltage divided by the sum of the current steering device resistance ($R_{CSD}$) and the resistance of the variable layer ($R_{VR}$). Therefore, in one example, the $I_{OFF}$ current for the standard memory device 200A will be as follows.

$$I_{OFF} = \sim V_{READ}/(R_{CSD}+R_{VR})$$

Figure 5B:
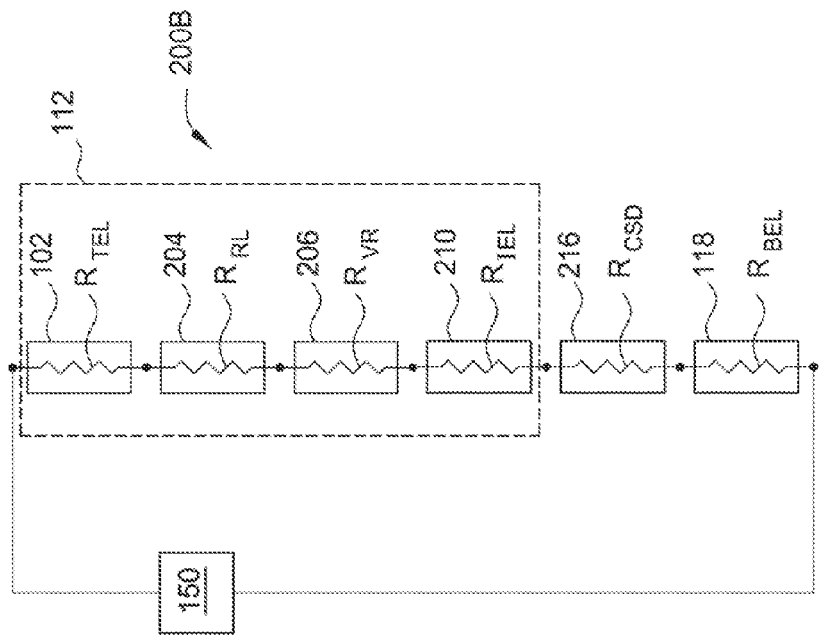
FIG. 5B is a schematic representation of an electrical circuit formed in the memory element illustrated in FIG. 5A in accordance with an embodiment of the invention.
Figure 5A:
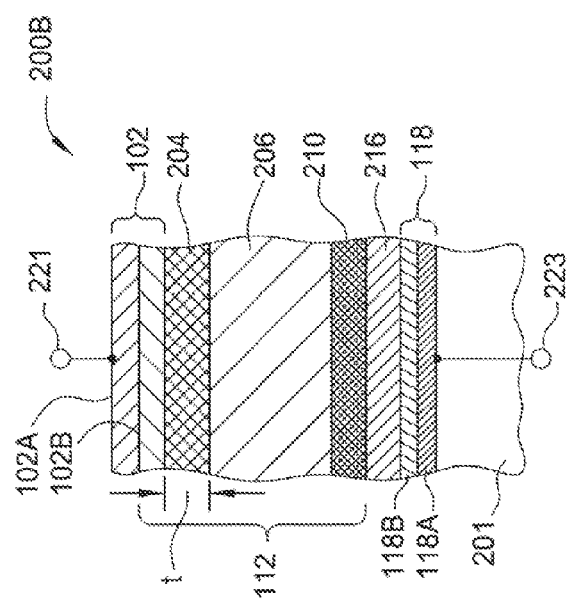
FIG. 5A is a schematic side cross-sectional view of a memory element disposed in a nonvolatile memory device in accordance with an embodiment of the invention.

FIG. 5A is a schematic side cross-sectional view of one embodiment of an improved switching memory device 200B that contains a memory element 112 and a current steering device 216 that are disposed between electrodes 102 and 118 and are formed over a portion of a substrate 201. The switching memory device 200B contains a current limiting component, such as resistive layer 204 that is configured to improve the device's switching performance and lifetime. In this configuration, the memory element 112 will generally contain a top electrode 102, a resistive layer 204, a variable resistance layer 206 and an intermediate electrode 210. In one embodiment, the resistive layer 204 is disposed within the improved switching memory device 200B close to the variable resistance layer 206 and/or current steering device 216 to effectively limit or prevent the propagating programming current pulses (e.g., "set" or "reset" pulses) delivered through the switching memory device 200B from damaging the layers formed therein during normal device operation. Positioning the resistive layer 204 near the variable resistance layer 206 and/or current steering device 216 can be important in switching memory devices 200B that utilize high speed transient programming pulses, such as square or trapezoidal shaped pulses that are less than about 1 ms in length. It is believed that the use of an externally positioned resistive element in a circuit in which the switching memory device 200B is formed, such as resistive layers or structures formed on other parts of the chip in which the switching memory device 200B is formed, will not effectively prevent the delivered high speed programming pulse energy from causing the materials in the variable resistance layer 206 and/or current steering device 216 from breaking down when the high speed transient programming pulses are delivered through the switching memory device 200B. It is believed that the propagation delay created by the transmission of the high speed programming pulse through the length of the electrical circuit formed between the external resistive element and the switching memory device 200B components (e.g., variable resistance layer 206 and current steering device 216) will generally prevent the externally positioned resistive element from effectively reducing or dropping the instantaneous amount of energy passing through the variable resistance layer 206 and current steering device 216 as the high speed programming pulse passes through the switching memory device 200B in the forward and/or reverse bias directions. In one embodiment, the resistive layer 204 is disposed in close proximity to the variable resistance layer 206, such as substantially adjacent to the variable resistance layer 206. One will note that the position of the resistive layer 204 in the switching memory devices 200B need not be limited to the position shown in FIG. 5A, and thus the configuration as shown is not intended to be limiting as to the scope of the invention described herein. In one embodiment, the resistive layer 204 is disposed between the variable resistance layer 206 and the current steering device 216. In one embodiment, the resistive layer 204 can be placed between any adjacently positioned layers in the formed switching memory device 200B, such between the intermediate electrode 210 and the variable resistance layer 206 or between the intermediate electrode 210 and the current steering layer 216.

In one embodiment, as illustrated in FIG. 5A, the electrodes 102 and 118 may each comprise more than one layer of conductive material. In one configuration, the top electrode 102 may comprise a first conductive layer 102A and a second conductive layer 102B, and the bottom electrode 118 may comprise a first conductive layer 118A and a second conductive layer 118B. In this case, the first conductive layer 102A in the top electrode 102 and the first conductive layer 118A in the bottom electrode 118 can be used to interconnect multiple switching memory devices 200B in an array of formed devices, and thus may act as word-lines or bit-lines. The second conductive layer 102B and the second conductive layer 118B may each comprise a material that has desirable electrical properties (e.g., work function) so that these layers can help improve the electrical characteristics of the memory element 200B. The first conductive layer 102A and/or first conductive layer 118A may comprise, for example, tungsten (W), aluminum (Al) or copper (Cu), while the second conductive layer 102B and/or the second conductive layer 118B may comprise, for example, titanium (Ti), titanium nitride (TiN), or doped poly-silicon. One will note that the configuration shown in FIG. 5A and discussed herein is not intended to limiting as to the scope of the invention described herein, since, for example, the electrodes 102 and 118 may comprise a single conductive layer, and the position of the various layers, or number of layers, in the stack of layers used to form switching memory device may be altered without deviating from the basic scope of the invention described herein.

In one embodiment, the resistive layer 204 and the second conductive layer 102B are formed as a single layer (not shown) that has desirable resistive properties and desirable work function to improve the device switching memory device 200B's performance and increased usable lifetime. In this configuration, the combined layer will comprise a conductive material, such as hafnium nitride (HfN) that has the same attributes of the resistive layer 204 and the second conductive layer 102B as discussed herein.

FIG. 5B schematically illustrates an electrical circuit formed by the switching memory device 200B shown in FIG. 5A. As illustrated in FIG. 5B, the electrical circuit within the switching memory device 200B includes a top electrode impedance (i.e., resistance $R_{TEL}$) created by the top electrode 102 layer(s), a resistive layer impedance (i.e., resistance $R_{RL}$) created by the resistive layer 204, a variable resistance layer impedance (i.e., resistance $R_{VR}$) created by the variable resistance layer 206, an intermediate electrode impedance (i.e., resistance $R_{IEL}$) created by the intermediate electrode 210 layer(s), a current steering device impedance (i.e., resistance $R_{CSD}$) created by the current steering device 206 and a bottom electrode impedance (i.e., resistance $R_{BEL}$) created by the bottom electrode 118 layer(s).

Referring back to FIG. 4B, in one example, a "set" switching pulse 411, or "set" pulse 403, is delivered through the switching memory device 200B to create a low resistance state, or logic "one" state. In this configuration, a "set" voltage $V_{SET}$ is applied across electrodes 102 and 118, which creates a "set" current $I_3$ to flow through the switching memory device 200B, due to the impedance of the components in the switching memory device 200B. The pulse 411 when applied to one configuration of the switching memory device 200B will generally achieve a "set" current $I_3$ during the later stages of the "set" operation as the variable resistance layer 206 changes from the HRS to the LRS. The "set" current $I_3$ will equal the $V_{SET}$ voltage divided by the sum of the impedances in the switching memory device 200B. Therefore, in one example, the "set" current $I_3$ will equal the following.

$$I_3 = V_{SET}/(R_{TEL} + R_{RL} + R_{VR} + R_{IEL} + R_{CSD} + R_{BEL}).$$

Therefore, since the impedance of the electrodes are generally small, due to the need to reduce the power loss in the device, and the impedance of the variable resistive layer is desirably low to achieve a logic "one" state, the impedance of the current steering device and the resistive layer will dominate the circuit (e.g., $(R_{RL} + R_{CSD}^*) \gg R_{TEL} + R_{IEL} + R_{BEL} + R_{VR}$) and the impedance of the circuit in this state is effectively equal to the sum of the impedances of the current steering device and the resistive layer (i.e., $R_{RL} + R_{CSD}$). Therefore, referring to FIG. 4B, the magnitude of the "set" current $I_3$ created by a "set" pulse 403 will equal a current ($I_3$), which can be adjusted by the selection of a desired fixed impedance value of the resistive layer 204. One will note that due to the presence of the added impedance ($R_{RL}$) of the resistive layer 204 in the switching memory device 200B, versus the standard switching memory device 200A (FIG. 3A), the actual impedance ($R_{CSD}^*$) of the current steering device 216 will generally be greater than the impedance of a current steering device 216 disposed in the standard current steering device 200A, since the added voltage drop of the resistive layer 204 in the device circuit will prevent the current steering device 216 from being damaged by the application of the programming currents during normal operation. As noted above, since the current steering device 216 in a standard switching memory device 200A (FIG. 3A) is the primary voltage drop during the "set" operation (e.g., switch to "on" state), the current steering device 216 often is required to operate near its breakdown voltage to reliably cause the variable resistance layer 206 to switch, which will generally not be the case in the switching memory device 200B due to the added voltage drop provided by the resistive layer 204. The addition of the resistive layer 204 in the switching memory device 200B reduces the voltage applied across the current steering device 216, and thus prevents the impedance of the current steering device 216 from dropping due to the application of a voltage near the breakdown state of the material and/or degrading over time due to damage created by the repetitive application of the programming voltages.

Figure 6:
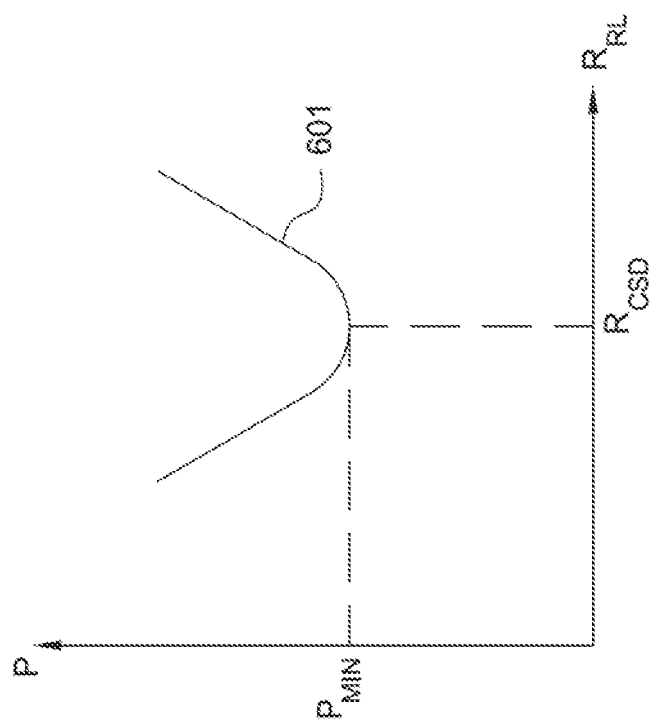
FIG. 6 is a graph illustrating power loss versus the magnitude of the resistive layer impedance when a switching or sensing current is delivered through the resistive layer in accordance with an embodiment of the invention.

In general, it is desirable to optimize the impedance of the circuit containing the memory element 112 to reduce the power lost in the device by controlling the current flow through the device. FIG. 6 is a graph illustrating a plot of power loss (P) versus the magnitude of the resistive layer impedance ($R_{RL}$) (e.g., trace 601), created by passing a current through the resistive layer 204. One will note that the power (P) loss through the resistive layer 204 is equal to the square of the current (I) times the resistive layer impedance ($R_{RL}$), or $P = I^2 R_{RL}$. The current (I) through the switching memory device 200B is equal to the applied voltage (V) across the electrodes 102 and 118 divided by the sum of the impedances in the circuit.

$$I = V/(R_{TEL} + R_{RL} + R_{VR} + R_{IEL} + R_{CSD} + R_{BEL}).$$

However, if we assume that the variable resistance layer 206 is in its low resistance state and that the electrode impedances (e.g., $R_{TEL}$, $R_{IEL}$, $R_{BEL}$) are negligible as compared to the impedance of the current steering device impedance ($R_{CSD}$) and the resistive layer ($R_{RL}$), the power loss (P) through the resistive layer 204 can be expressed as follows.

$$P = I^2 R_{RL} = (V^2/(R_{RL} + R_{CSD})^2) R_{RL} = V^2/((R_{CSD}^2/R_{RL}) R_{RL} + 2R_{CSD})$$

One will note that the power (P) loss versus the magnitude of the resistive layer impedance ($R_{RL}$), as illustrated by trace 601 in FIG. 6, has an inflection point at which the power loss and current (I) is a minimum. The point at which the current is a minimum, coincides with the case where the resistive layer impedance is equal to the current steering device impedance (e.g., $R_{RL} = R_{CSD}$). Therefore, in one embodiment of the invention, it is desirable to form the resistive layer 204, such that the magnitude of its impedance is substantially equal to the magnitude of the impedance of the current steering device impedance ($R_{CSD}$). One will note that in a more general case where the variable resistance layer 206 impedance ($R_{VR}$) is not negligible relative to the current steering device impedance and the resistive layer impedance, the inflection point will occur where the resistive layer impedance is equal to the current steering device impedance plus the variable resistance layer 206 impedance at the low resistive state (e.g., $R_{RL} = R_{CSD} + R_{VR}$).

However, due to the need to improve switching performance characteristics of the variable resistance layer 206, in some cases it is desirable to adjust the formed resistance of the resistive layer 204 so that the applied voltage (i.e., $V_{SET}$ or $V_{RESET}$) causes a current to flow in the device that is somewhere between the maximum allowable current, or load current $I_L$, and the minimum current required to switch the device from one logic state to another (i.e., $I_{MSC}$ or $I_{MRC}$). In one example, the resistive layer impedance $R_{RL}$ is formed so that it has an impedance equal to a minimum "set" resistance ($R_{MSR}$) value, where the minimum "set" resistance ($R_{MSR}$) is equal to the minimum "set" voltage $V_{MSET}$ applied across the electrodes 102 and 118 divided by the minimum "set" current ($I_{MSC}$) flowing through the device minus the sum of all of the other series resistance in the switching memory device 200B, or $$R_{MSR}=R_{RL}=[(V_{MSET}/(I_{MSC}))-(R_{TEL}+R_{VR}+R_{IEL}+R_{CSD}+R_{BEL})],$$

where the minimum "set" voltage $V_{MSET}$ is the "set" voltage required to achieve the minimum "set" current ($I_{MSC}$) through the formed switching memory device 200B. Therefore, assuming variable resistance layer 206 resistance and the electrode resistances are much smaller than the current steering device impedance ($R_{CSD}$) when the variable resistance layer 206 is in the low resistance state the minimum "set" resistance will approximately equal the following.

$$R_{MSR}=R_{RL}=(V_{MSET}/(I_{MSC}))-R_{CSD}.$$

In general, it is desirable to assure that the resistive layer impedance $R_{RL}$ is non-zero to prevent the current flowing through the switching memory device 200B from reaching the load current ($I_L$). In one example, it is desirable to form a resistive layer 204 that has a resistance equal to an impedance that is between about 75% and about 125% of the impedance of the current steering device impedance ($R_{CSD}$). In one example, the resistive layer impedance ($R_{RL}$) is between about 10 k$\Omega$ and about 10 M$\Omega$, such as between about 100 k$\Omega$ and about 1 M$\Omega$.

As the size of switching memory devices shrink to improve device performance and storage capacity, the programming parameters that cause the variable resistance layer 206 to switch also need to be adjusted. Typically, the programming parameters that need to be adjusted as device size is reduced include the applied switching current ($I_{switch}$) and voltage drop applied across the variable resistance layer 206 ($\Delta V_{VR}$). In general, a device's programming parameters are limited by the maximum applied voltage ($V_{MAV}$) that can be applied across the electrodes 102 and 118, which is usually defined for each type of device by industry standards and/or by a device manufacturer's device "product specification." In one example, the product specification for a 65 nm technology node non-volatile memory device has a maximum applied voltage ($V_{MAV}$) of about 8 Volts. To reliably cause a memory element 112 to switch, it is believed that both the voltage drop applied across the variable resistance layer 206 needs to be above a minimum switching voltage ($V_{MSV}$) and the current delivered through the variable resistance layer 206 must be greater than the minimum switching current ($I_{MSWC}$). It is believed that the electric field created in the variable resistance layer 206, due to the application of a voltage greater than the minimum switching voltage ($V_{MSV}$), and the application of a current greater than the minimum switching current ($I_{MSWC}$) will cause the movement and alignment (e.g., "On" state), or non-alignment (e.g., "Off" state), of the vacancy type defects in the variable resistance layer 206, which causes the variable resistance layer 206 to more reliably switch between the desirable "On" and "Off" states. It is also believed that the electric field created by the minimum switching voltage ($V_{MSV}$) and application of the minimum switching current ($I_{MSWC}$) are both required to assure that all of the devices in an array of formed switching memory devices 200B will all reliably switch. It is noted that by adjusting the material properties of the variable resistance layer 206 (e.g., material composition, thickness, defect density, crystal structure) the switching characteristics of the formed variable resistance layer 206 can be adjusted.

However, as noted above, the ability to provide a voltage drop across the variable resistance layer 206 that exceeds the minimum switching voltage ($V_{MSV}$) and provide a current that exceeds the minimum switching current ($I_{MSWC}$) is limited by the maximum applied voltage ($V_{MAV}$) that can be applied across the electrodes 102 and 118. The voltage drops formed within a switching memory device 200B when a maximum applied voltage ($V_{MAV}$) is applied, will equal the sum of the voltage drops created between the electrodes 102 and 118, which can be defined as follows.

$$V_{MAV}=\Sigma\Delta V_i=\Delta V_{TEL}+\Delta V_{RL}+\Delta V_{VR}+\Delta V_{IEL}+\Delta V_{CSD}+\Delta V_{BEL}$$

Stated another way, the maximum applied voltage ($V_{MAV}$) will cause an applied current ($I_{MAV}$) to flow through the total resistance ($R_{Total}$) of the switching memory device 200B.

$$V_{MAV}=I_{MAV}\times R_{Total}=I_{MAV}\times \Sigma R_i; \text{ or}$$

$$V_{MAV}\approx I_{MAV}\times(R_{TEL}+R_{RL}+R_{VR}+R_{IEL}+R_{CSD}+R_{BEL})$$

If we assume that the electrode impedances (e.g., $R_{TEL}$, $R_{IEL}$, $R_{BEL}$) are negligible, as compared to the resistive layer impedance ($R_{RL}$), the current steering device impedance ($R_{CSD}$) and the variable resistance layer impedance ($R_{VR}$) the equation(s) can be further simplified to the following.

$$V_{MAV}\approx I_{MAV}\times(R_{RL}+R_{VR}+R_{CSD})=\Delta V_{RL}+\Delta V_{VR}+\Delta V_{CSD}$$

Therefore, if one assumes that the resistance of the variable resistance layer 206 in either the high or the low resistance states remains relatively constant during the useable life of the device, and that the resistive layer impedance is as large as possible (i.e., maximum resistance layer impedance ($R_{RL}^*$)), while still allowing the device to reliably switch, the generated applied current ($I_{MAV}$) will equal the minimum switching current ($I_{MSWC}$) and the load resistance will equal the following.

$$R_{RL}^*=(V_{MAV}/I_{MSWC})-(R_{VR}+R_{CSD}) \quad (1)$$

Where $R_{VR}$ is either in a high resistance state or in a low resistance state depending on whether the device is in an "On" or "Off" resistance state, the minimum switching current ($I_{MSWC}$) will vary depending on the type of operation being performed (e.g., switching between "On" and "Off" states) and the $R_{CSD}$ varies depending whether it is forward or reverse biased. If the resistance layer impedance ($R_{RL}$) exceeds the maximum resistance layer impedance ($R_{RL}^*$) the device will not reliably switch between operating states, and thus should be avoided.

In one example, for a 65 nm technology node non-volatile memory device that has a maximum applied voltage ($V_{MAV}$) of about 8 Volts the maximum resistance layer impedance ($R_{RL}^*$) is desirably less than about 590-600 k$\Omega$, so that a minimum switching current of about 10 microamps ($\mu$A) can be achieved during a "reset" operation. Also, in one example, for a 65 nm technology node non-volatile memory device that has a maximum applied voltage ($V_{MAV}$) of about 8 Volts the maximum resistance layer impedance ($R_{RL}^*$) is desirably less than about 590-600 k$\Omega$, so that the minimum switching current of about 610 nanoamps (nA) can be achieved during a "set" operation. One will note that in these examples, the variable resistance layer impedance ($R_{VR}$) in the LRS state may be about 200 kΩ and the impedance in the HRS state may be about 2.5 MΩ, while the current steering device impedance ($R_{CSD}$) in the forward direction may be about 10 kΩ and in the reverse direction may be about 10 MΩ.

Referring to FIG. 4B, in general, it is desirable to form the resistive layer 204 so that its impedance ($R_{RL}$) limits the current through the memory element 112 to a value (e.g., current $I_2$) that is just greater the minimum "set" current $I_{MSC}$, as illustrated by pulse 402, and still allow the "on" logic state to be reliably "set" by the applied $V_{SET}$ voltage. It is believed that by adding the resistive layer 204 to a memory element 112 can also help reduce the apparent minimum $I_{MSC}$ current required to cause the variable resistance layer 206 to change to a low resistive state, since the addition of the resistive layer impedance ($R_{RL}$) in the circuit will reduce the swing in current between the "set" and "reset" switching currents at the same fixed applied voltage, thus affecting the density and movement of the traps in the variable resistance layer 206. Not intending to be bound by theory, but it is believed that when a smaller "on" state switching current is applied to a device that the formed filament(s), or aligned traps, in the variable resistance layer will be smaller in size than if a higher "on" current is applied, thus making the filament(s) easier to alter during the "reset" phase of the resistive switching process.

In one embodiment, it has also been found that the resistance layer impedance ($R_{RL}$) having a magnitude that is at least greater than about the current steering device impedance ($R_{CSD}$) is desirable to: 1) prevent the "set" programming current from reaching the load current ($I_L$) when the maximum applied voltage ($V_{MAV}$) is applied, 2) allow the device to reliably switch during the "set" operation, and 3) desirably minimize the magnitude of the peak "reset" programming current (e.g., current $I_C$).

One will note that the minimum switching voltage $V_{MSV}$ and/or minimum switching current ($I_{MSWC}$) will vary depending on whether the device is in an "on" or "off" state and also vary due to the properties of the variable resistance layer 206 material, and thus will each have some measurable value that is related to the resistive switching properties of the formed variable resistance layer 206. The minimum switching voltage can be written as the following.

$$V_{MSV} = V_{MAV} - (I_{MSWC} \times (R_{RL} + R_{CSD})) \quad (2)$$

Therefore, since the switching characteristics of a formed variable resistance layer 206 is dependent on the electrical and physical properties of the formed variable resistance layer 206, the selection of a resistance layer impedance ($R_{RL}$) is important, since it effectively limits the switching characteristics of variable resistance layers 206 that can be used to reliably switch a device during operation. Therefore, the resistance layer impedance ($R_{RL}$) will affect the type of resistive switching materials and/or switching layer properties that can be used in a reliable device.

In some embodiments, it is desirable to form the resistive layer 204 from a material that will not significantly vary in resistance when the "set" and "reset" switching currents are applied to the switching memory device 200B. Forming the resistive layer 204 from a material that has a generally constant resistance will assure that the switching characteristics of the device will not change over the life of the switching memory device 200B, due to changes in the material in the formed layer. Also, forming the resistive layer 204 from a material that does not significantly vary in resistance during the programming steps, due to the use of a non-resistive switching material, has many advantages that include: 1) less variability in the electrical properties of the formed layer due to variations in the deposition process (e.g., defect density variations), 2) less variability in the electrical properties of the formed layer over the lifetime of the formed memory device due to any physical or chemical change in the resistive layer material and 3) a lower device performance variability that is created by differences in the "forming" process (i.e., application of the forming voltage ($V_{FORM}$)). In one configuration, the resistive layer has a single resistive state, since it does not significantly vary in resistance during the electrical "forming" and/or programming steps. It is desirable to form the resistive layer 204 so that its material and electrical properties will not degrade or breakdown during the electrical "forming" process, and also during normal repetitive operation of the switching memory device 200B.

Device Structure and Formation Processes

In one embodiment, as discussed above, a memory array 100 (FIG. 1) comprises a plurality of switching memory devices 200B that are each interconnected by the electrodes 102 and 108. As illustrated in FIG. 5A, a switching memory device 200B may comprise a top electrode 102, a resistive layer 204, a variable resistance layer 206, an intermediate electrode 210, a current steering device 216 and an electrode 118. In one configuration, as noted above, the current steering device 216 comprises a p-n junction diode, p-i-n diode, transistor, or other similar device that is disposed between electrode 102 and memory element 112, or between the electrode 118 and memory element 112. In one example, the current steering device 216 may include two or more layers of a semiconductor material, such as two or more doped silicon layers, that are configured to direct the flow of current through the device. In one example, the current steering device is a diode that comprises a p-doped silicon layer (not shown), an un-doped intrinsic layer (not shown), and an n-doped silicon layer (not shown) that has an overall resistance between about 1 kΩ and about 100 MΩ. The overall resistance will generally depend on the type of current steering device that is formed and in what direction current is flowing through the device (e.g., forward or reversed biased).

The electrodes 102, 210 and 118 disposed in the switching memory device 200B are generally formed from a conductive material that has a desirable conductivity and work function. In some configurations, the electrode 102, 210 and/or 118 disposed in the switching memory device 200B are each formed from different materials, which may include, but are not limited to p-type polysilicon, n-type polysilicon, transition metals, transition metal alloys, transition metal nitrides, and transition metal carbides. In one example, the electrode 102 and the electrode 118 comprise a metal, metal alloy, metal nitride or metal carbide formed from an element selected from a group consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof. In one example, the electrodes 102 and 118 comprise a metal alloy selected from the group of a titanium/aluminum alloy, or a silicon-doped aluminum (AlSi). In one embodiment of the switching memory devices 200B, the electrodes 102 and 118 comprise a metal, such as a transition metal, transition metal alloy, transition metal carbide, transition metal nitride (e.g., TiN), and the intermediate electrode 210 comprises a heavily doped semiconductor material, such as a heavily doped silicon material (e.g., n-type polysilicon material) that interfaces well with the current steering device 216. In one example, the intermediate electrode 210 comprises polysilicon and is between about 50 and about 500 angstroms (Å) thick, and the electrodes 102 and 118 are between about 50 Å and 5000 Å thick and comprise a metal, such as titanium nitride (TiN).

The variable resistance layer 206 disposed in a switching memory device 200B can be a dielectric material, such as a metal oxide material or other similar material that can be switched between at least two or more stable resistive states. In some embodiments, the variable resistance layer 206 is a high bandgap material (e.g., bandgap>4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). It has been found that using high band gap variable resistance layer materials will improve data retention in the memory element 112, and reduce the leakage current in the formed memory element device, since the amount of trapped charge in the variable resistance layer material will be less than a lower band gap material, and the high band gap materials create a large barrier height that the carriers have to cross during the read, "set" and "reset" operations. In other embodiments, lower bandgap metal oxide materials can be used, such as titanium oxide ($TiO_x$), nickel oxide ($NiO_x$) or cerium oxide ($CeO_x$) may be advantageous for some embodiments. In some cases, a semiconductive metal oxide (p-type or n-type) such as zinc oxides ($Zn_xO_y$), copper oxides ($Cu_xO_y$), and their nonstoichiometric and doped variants can be used. The variable resistance layer 206 may comprise a metal oxide (e.g., $HfO_2$) layer formed to a thickness of between about 10 and about 100 angstroms (Å). In one configuration, the variable resistance layer 206 is doped with a material that has an affinity for oxygen (e.g., transition metals (Al, Ti, Zr)) to form a metal-rich variable resistance layer (e.g., $HfO_{1.7}$ vs. $HfO_2$), which is deficient in oxygen, and thus has a larger number of oxygen vacancy type defects. The additional vacancy defects can reduce the required switching and forming voltages, reduce the device operating current(s), and reduce the device to device variation in a formed memory element. In one example, the variable resistance layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$ and/or $Zr_xO_y$, formed to a thickness of between about 20 and about 100 angstroms (Å), such as between about 30 and about 50 angstroms (Å). The variable resistance layer 206 can be deposited using any desired technique, but in some embodiments described herein is deposited using an ALD process. In other embodiments, the variable resistance layer 206 can be deposited using a CVD (e.g., LPCVD, PECVD) or ALD (e.g., PEALD), physical vapor deposition (PVD), liquid deposition processes, and epitaxy processes. It is believed that PEALD processes can be used to control defects and improve switching and forming voltages in some embodiments. In one example, an ALD process using tetrakis(dimethylamino) hafnium (TDMAH) and an oxygen containing precursor at a temperature of about 250° C. is used to form an 50 Å thick hafnium oxide ($Hf_xO_y$) containing variable resistance layer 206.

The resistive layer 204 generally comprises a resistive material that can be reliably and consistently formed within the switching memory devices 200B. In one embodiment of the switching memory device 200, it is desirable to select a material from which the resistive layer 204 is formed, which has a desirable work function to better control the electron flow between the resistive layer 204 and the variable resistance layer 206. In this case, by selecting and forming a resistive layer 204 that desirably alters the work function of the electrode 102 or 210 disposed adjacent to the variable resistance layer 206, the magnitude of the required $I_{ON}$ and $I_{OFF}$ currents can be adjusted. In one configuration of the memory element 112, the formed resistive layer 204 is used to increase or decrease the formed barrier height at the interface between the resistive layer 204 and the variable resistance layer 206 to adjust the ease with which current will flow through the formed interface in the formed device when a voltage is applied across the electrodes. An increased barrier height will thus tend to reduce the magnitude of the $I_{ON}$ and $I_{OFF}$ current that will flow through the device during operation, due to the increased energy required to move the electrons over and/or tunnel through the barrier and allow the current to flow through the device. One will note that the increase in barrier height will generally not affect the current ratio ($I_{ON}/I_{OFF}$), and thus not affect one's ability to detect the different logic states in the switching memory device.

To achieve a resistive layer that has desirable electrical and/or physical properties, one or more steps in a resistive layer 204 deposition process can be adjusted to form a layer that has desirable properties. As discussed above, in some cases it is desirable to adjust the resistance of the resistive layer 204, so that it matches the resistance of the formed current steering device 216 in the formed switching memory device 200B. One skilled in the art will appreciate that the resistance (R) to current flow through a thin film is equal to the resistivity ($\rho$) of the film times the length (L) of the film divided by its cross-sectional area (A), or resistance $R=\rho(L/A)$, where the length L is equal to the thickness of the layer, since the current flows through the thickness of the layer, and the cross-sectional area (A) is measured perpendicular to the current flow direction (e.g., perpendicular to the thickness direction). Resistivity ($\rho$) is an intrinsic property of the formed layer that can be adjusted in some cases by adjusting the composition of the layer, such as adding alloying elements or doping atoms, or by adjusting the crystalline structure of the layer (e.g., crystal structure). Since the cross-sectional area (A) of the device is generally fixed by the size and lateral spacing of the switching memory devices 200B, and thus is generally not easily varied from one switching memory device to the next, the resistance R of the resistive layer 204 can be controlled by the adjustment of the thickness "t" (FIG. 5A) and/or the resistivity ($\rho$) of the formed layer. Typical deposition processes may include ALD, PVD and CVD processes that can be tailored to adjust the material resistivity and thickness of the deposited resistive layer 204. In one example, for a memory element 112 that is about 150 nm×150 nm is size, a resistive layer 204 that is about 300 Å thick and has a resistivity of 75 Ω-cm will achieve a resistance of about 1 MΩ, so as to match the resistance found in a current steering device that has a resistance of about 1 MΩ. In another example, the resistive layer 204 is formed so that its impedance ($R_{RL}$) is between about 10 kΩ and about 10 MΩ, such as between about 100 kΩ and about 1 MΩ.

Materials used to form the resistive layer 204 can include resistive metals, doped semiconductors and conductive dielectric materials. In one configuration, the resistive layer 204 includes a semiconductor and/or dielectric material that has a breakdown voltage that exceeds the breakdown voltage of the variable resistance layer 206. Resistive layer 204 materials that have a breakdown voltage that is less than the variable resistance layer 206 material's breakdown voltage will become damaged during the application of the forming voltage ($V_{FORM}$), which is discussed above. Therefore, in one embodiment of the invention, the material in a formed resistive layer 204 disposed in a formed memory element 112 has a breakdown voltage that is greater than the breakdown voltage of the material found in the variable resistance layer 206. In one example, the resistive layer 204 comprises a silicon nitride ($Si_xN_{1-x}$) layer that is formed using a CVD process. Resistive layers comprising silicon nitride can be advantageous due to their high breakdown voltage. In another example, the resistive layer 204 comprises an n-type or p-type doped silicon layer that is formed using a CVD process. By adjusting the doping level and type of dopant atom in the formed layer, the resistivity of the doped silicon layer can be varied from between about $10^{-5}$ Ω-cm and about $10^5$ Ω-cm. In one example, a p-type silicon layer having a resistivity of about 0.1 Ω-cm is achieved by forming a silicon layer that has a boron (B) doping level of about $8\times10^{16}$ atoms/$cm^3$. In yet another example, the resistive layer 204 comprises metal, such as titanium nitride ($Ti_xN_y$), tantalum nitride ($Ta_xN_y$), silicon nitride (SiN), hafnium nitride ($Hf_xN_y$) or titanium aluminum nitride ($Ti_xAl_yN_z$) layer that is formed using an ALD, CVD or PVD process. In yet another example, the resistive layer 204 comprises a material selected from the group of titanium (Ti), tantalum (Ta), aluminum (Al), zirconium (Zr), hafnium (Hf) or silicon (Si). In some configurations, the composition of the metal containing layer can be adjusted to change the resistivity of the formed layer. In one configuration, the nitrogen level in a deposited layer, such as a silicon nitride, a tantalum nitride or a hafnium nitride containing layer, is adjusted to control the resistivity (ρ) of the formed layer. In some deposition processes, the resistivity of the formed nitrogen containing layer is controlled by adjusting the partial pressure of nitrogen in the processing region of the deposition chamber during a CVD, PVD, or ALD deposition process.

Switching Memory Device Fabrication Processes

Figure 7:
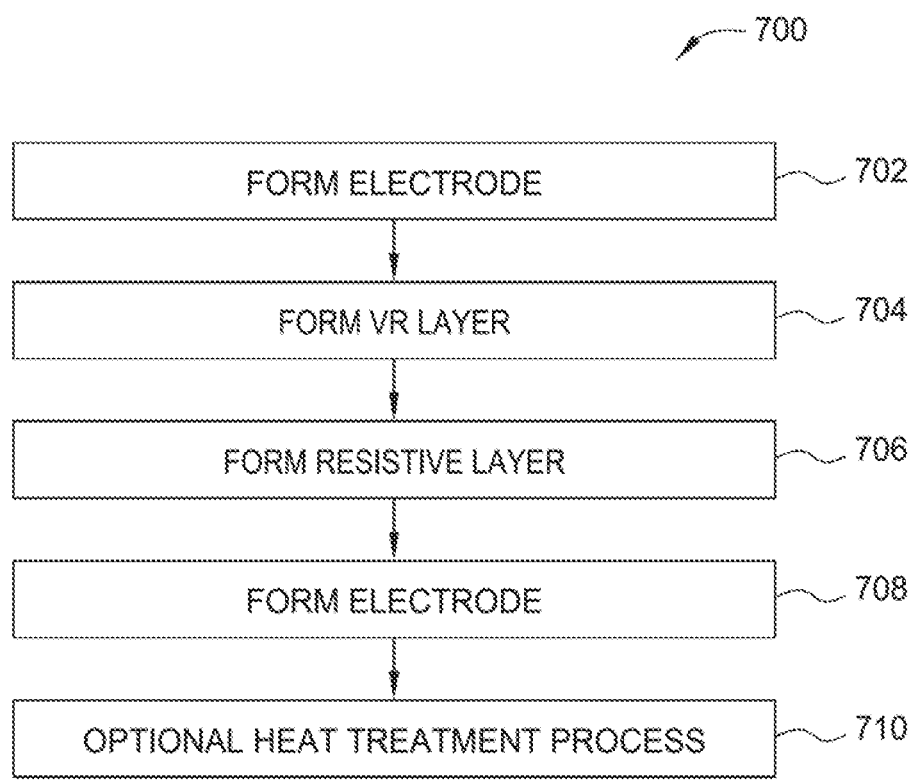
FIG. 7 is a schematic depiction of a process for forming the switching memory device according to one embodiment of the invention.

FIG. 7 illustrates a process sequence 700 that can be used to form a memory element 112 components in a switching memory device 200B illustrated in FIG. 5A, according to one embodiment of the invention. While omitted from the discussion below, the electrode 118 and current steering device 216 elements can be formed over a portion of a substrate 201, such as a silicon substrate, by use of a physical vapor deposition (PVD), chemical vapor deposition (CVD), atomic layer deposition (ALD), or other similar process that is well known in the art. In some configurations, it is desirable to determine the empirical or theoretical resistance of the current steering device 216 structure in the memory element 112, so that the resistance of the resistive layer 204 can be adjusted relative to the expected resistance of the formed current steering device 216. In one example, the current steering device 216 is a diode that comprises a p-doped silicon layer (not shown) that is formed by a CVD process, an un-doped intrinsic layer (not shown) that is formed by an CVD process, and an n-doped silicon layer (not shown) that is formed by a CVD process. In one example, the electrode 118 comprises a layer of titanium nitride (TiN) that is between about 500 Å and 1 μm thick and is formed by use of a PVD process.

Referring to FIGS. 5A and 7, at step 702 an intermediate electrode 210 is formed over a substrate 201. In one embodiment, the intermediate electrode 210 is a highly doped polysilicon layer that is formed using a conventional CVD or ALD type polysilicon deposition technique. In some cases, an optional native oxide layer removal step may be performed after forming the intermediate electrode layer 210 by use of a wet chemical processing technique, or conventional dry clean process that is performed in a plasma processing chamber. In one example, the intermediate electrode 210 comprises polysilicon that is between about 50 and about 5000 angstroms (Å) thick, which is formed by use of a CVD or ALD polysilicon deposition process.

Referring to FIGS. 5A and 7, at step 704, the variable resistance layer 206 is deposited over the intermediate electrode 210 using a PVD, CVD or ALD deposition process. The variable resistance layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$ and/or $Zr_xO_y$, formed to a thickness of between about 20 and about 100 angstroms (Å), such as between about 30 and about 50 angstroms (Å). The variable resistance layer 206 can be deposited using any desired technique, but in some embodiments described herein is deposited using an ALD process. In one example, an ALD process using tetrakis(dimethylamino)hafnium (TDMAH) and an oxygen containing precursor (e.g., water vapor) at a temperature of about 250° C. is used to form a 30 Å thick hafnium oxide ($Hf_xO_y$) which acts as the variable resistance layer 206.

At step 706, as depicted in FIGS. 5A and 7, a resistive layer 204 is formed over the variable resistance layer 206 using a deposition process, such as a PVD, CVD, ALD or other similar process. In one embodiment, the resistive layer 204 is a metal nitride layer (e.g., $Hf_xN_y$, $Ta_xN_y$), a metal oxide layer (e.g., $Al_2O_3$, $ZrO_2$), or semiconductor layer (e.g., doped Si, $Si_xN_y$) that is formed by use of a PVD, CVD or ALD process. In one example, the resistive layer 204 may be formed to a thickness between about 50 and about 500 angstroms, and comprise a material such as Ta, Ti, Hf, or Si. In one example, the resistive layer 204 layer is formed using a PVD process that deposits a $Hf_xN_y$ layer at a deposition rate of between about 4 to 8 Å/minute using a pure hafnium target and maintaining the processing environment during the PVD deposition process to between about 1% and about 40% nitrogen ($N_2$) and the balance being argon (Ar) gas. It has been found that maintaining the nitrogen concentration in a PVD processing environment to a range between 10-15% nitrogen will create a layer that is highly resistive (e.g., $10^3$ to $10^5$ ohms/□), and maintaining the nitrogen concentration in a PVD processing environment to a concentration of greater than about 40% will form a dielectric layer. Therefore, one can adjust the layer thickness and resistivity to form a hafnium nitride layer containing resistive layer 204 that has a desirable resistance. In one process example, the nitrogen concentration in the processing environment during deposition is controlled to form a hafnium nitride (HfN) layer that has a desirable resistivity within a range of 1-500 Ohm-cm.

In another example of a process of forming a resistive layer 204, an ALD process using a tert-butylimido tris-diethylamido tantalum (TBTDET) or pentakis(dimethylamino)tantalum PDMAT precursor and ammonia ($NH_3$) at a temperature of about 150-300° C. is used to form a TaN film 50-500 Å thick. In one process example, the tantalum (Ta) to nitrogen (N) concentration is maintained at a ratio of about 1:1 to achieve a layer that has a resistivity of between about 1000 and about 5000 μΩ-cm.

In another example of a process of forming a resistive layer 204, an ALD process using a tetrakis(dimethylamino) titanium (TDMAT) precursor and ammonia ($NH_3$) at a temperature of about 100 to about 300° C. is used to form a TiN film that is between about 50 and about 500 Å thick. In one process example, the titanium (Ti) to nitrogen (N) concentration is maintained at a ratio of about 1:1 to achieve a layer that has a resistivity of between about 1000 and about 5000 μΩ-cm.

In yet another example of a process of forming a resistive layer 204, an ALD process using a tetrakis(dimethlyamino) hafnium (TDMAH) precursor and ammonia ($NH_3$) at a temperature of about 150-300° C. is used to form a HfN film 50-500 Å thick. It has been found that by maintaining the hafnium (Hf) to nitrogen (N) concentration during deposition at a ratio of about 1:1.3 a resistive switching having desirable switching properties can be achieved.

In yet another example of a process of forming a resistive layer 204, an ALD process using a tetrakis(dimethlyamino) zirconium (TDMAZ) precursor and ammonia ($NH_3$) at a temperature of about 150-300° C. is used to form a ZrN film 50500 Å thick. It has been found that by maintaining the zirconuim (Zr) to nitrogen (N) concentration during deposition at a ratio of about 1:1.3 a resistive switching having desirable switching properties can be achieved.

At step 708, the electrode 102 is formed over the resistive layer 204 as shown in FIG. 5A, using one or more of the materials that are discussed above. The electrode 102 layer may be deposited using a deposition process, such as a PVD, CVD, ALD or other similar process. In one example, the electrode layer 102 is between about 100 Å and 1000 Å thick. In one example, a PVD process is used to form an electrode 102 layer that comprises titanium nitride (TiN) and is between about 100 Å and 1000 Å thick.

At step 710, the formed switching memory device 200B is optionally annealed at a temperature of greater than about 550° C. In one example, the formed switching memory device 200B is annealed at a temperature of greater than about 700° C. In another example, the formed switching memory device 200B is annealed at a temperature of between about 550° C. and about 1000° C. for a period of time between about 30 seconds and about 20 minutes. The process(es) performed at step 710, are generally configured to cause the layers disposed in the switching memory device 200B to form the resistive layer 204, form a desirable interface between the resistive layer and its adjacent layer (e.g., electrode 102 and the variable resistive layer 206), as well as activate and/or desirably process the other layers formed in the switching memory device.

In an alternate version of the process sequence 700, the resistive layer 204 formation step, or step 706, is removed from the process sequence 700 and the resistive layer 204 is formed as part of, or at the end of, the intermediate electrode 210 formation process step (step 702). In one embodiment of the processing sequence 700, a resistive layer 204 is formed over the formed intermediate electrode 210 layer by use of a conventional CVD or ALD type deposition technique. In one example, the resistive layer 204 comprises polysilicon that is between about 50 and about 1000 angstroms (Å) thick, which is formed by use of a CVD or ALD polysilicon deposition process. In one process example, a polysilicon layer is formed by delivering silane ($SiH_4$) and hydrogen ($H_2$) gases into a CVD reactor at a temperature between about 600 and about 1000° C. to form a polysilicon layer having a desirable thickness. Phosphine, arsine or diborane may be added during the deposition process to dope the polysilicon layer with the chemical elements As, P, or B. Alternatively, after depositing the polysilicon layer, ion implantation may be used to dope the formed polysilicon layer with a desired dopant concentration of the chemical elements As, P or B. Then, after forming the doped polysilicon layer, an activation anneal at a temperature between about 600 and about 1000° C. is used to activate the dopants in the formed polysilicon layer. In one example, a desirable doping concentration are $10^{13}$-$10^{16}$ atoms/$cm^3$ is formed in the doped polysilicon layer to achieve resistivity in the range of 1-100 Ω-cm. The resistive layer 204 may comprise a polysilicon material that a lower doping level that causes the conductivity in the formed resistive layer 204 to be less than the conductivity of the intermediate electrode 210 layer.

In another alternate embodiment of the processing sequence 700, a resistive layer 204 is formed during the part of the intermediate electrode 210 layer formation process by adjusting one or more of the flows of the precursor gasses used in the CVD or ALD deposition process to form a layer that has differing electrical properties from the bulk intermediate electrode layer 210. In one example, the resistive layer 204 is formed at the end of the intermediate electrode 210 layer deposition process by reducing the amount or flow of a dopant precursor gas in the chamber to form a polysilicon layer that is between about 50 and about 1000 angstroms (Å) thick, and has a conductivity that is less than the intermediate electrode layer 210.

Process and Device Examples

In one example of a process of forming a switching memory device, after performing the steps 702-710 in the processing sequence 700, a memory element 112 is formed that comprises: an intermediate electrode 210 comprising an n-doped polysilicon layer, a variable resistance layer 206 that is about 50 Å thick and comprises hafnium oxide ($HfO_x$), a resistive layer 204 that is between about 50 Å and 500 Å thick and comprises hafnium nitride ($Hf_xN_y$), and an electrode 102 that comprises a layer of titanium nitride (TiN). After forming the switching memory device 200B (FIG. 5A), then at least one thermal processing step is performed, such as step 710, to form switching memory device 200B.

In another example of a process of forming a switching memory device, after performing the steps 702-710, a memory element 112 is formed that comprises: an intermediate electrode 210 comprising an n-doped polysilicon layer, a variable resistance layer 206 that is about 50 Å thick and comprises hafnium oxide ($HfO_x$), a resistive layer 204 that is between about 50 Å and 500 Å thick and comprises silicon nitride ($Si_xN_y$), and an electrode 102 that comprises a layer of titanium nitride (TiN). After forming the switching memory device 200B, then at least one thermal processing step is performed, such as step 710, to form switching memory device 200B.

In yet another example of a process of forming a switching memory device, after performing the steps 702-710, a memory element 112 is formed that comprises: an intermediate electrode 210 comprising an n-doped polysilicon layer, a variable resistance layer 206 that is about 50 Å thick and comprises hafnium oxide ($HfO_x$), a resistive layer 204 that is between about 50 Å and 1000 Å thick and comprises a silicon layer that is doped to a level of between about $10^{13}$ and about $10^{16}$ atoms/$cm^3$, and an electrode 102 that comprises a layer of titanium nitride (TiN). In one example, the resistive layer 204 comprises an n-type silicon layer that has a boron doping level of about $10^{13}$-$10^{16}$ atoms/$cm^3$. In another example, the resistive layer 204 comprises a p-type silicon layer that has a phosphorous doping level of about $10^{13}$-$10^{16}$ atoms/$cm^3$. After forming the switching memory device 200B, then at least one thermal processing step is performed, such as step 710, to form switching memory device 200B.

In another example of a process of forming a switching memory device, after performing the steps 702-710, a memory element 112 is formed that comprises: an intermediate electrode 210 comprising an n-doped polysilicon layer, a variable resistance layer 206 that is about 50 Å thick and comprises hafnium oxide ($HfO_x$), a resistive layer 204 that is between about 50 Å and 500 Å thick and comprises titanium nitride ($Ti_xN_y$), and an electrode 102 that comprises a layer of titanium nitride (TiN). After forming the switching memory device 200B, then at least one thermal processing step is performed, such as step 710, to form switching memory device 200B.

In another example of a process of forming a switching memory device, after performing the steps 702-710, a memory element 112 is formed that comprises: an intermediate electrode 210 comprising an n-doped polysilicon layer, a variable resistance layer 206 that is about 50 Å thick and comprises hafnium oxide ($HfO_x$), a resistive layer 204 that is between about 50 Å and 500 Å thick and comprises a stoichiometric tantalum nitride (TaN), layer and an electrode 102 that comprises a layer of titanium nitride (TiN). After forming the switching memory device 200B, then at least one thermal processing step is performed, such as step 710, to form switching memory device 200B.

The foregoing is merely illustrative of the principles of this invention and various modifications can be made by those skilled in the art without departing from the scope and spirit of the invention as defined by the claims that follow.

What is claimed is:

1. A semiconductor device comprising:
a first layer operable as a first electrode;
a second layer operable as a second electrode;
a third layer disposed between the first layer and the second layer,
    wherein the third layer is operable as a variable resistance layer; and
a fourth layer disposed between the first layer and the third layer,
    wherein the fourth layer is a resistive layer,
    wherein the fourth layer maintains a constant resistance during operation of the semiconductor device, and
    wherein the fourth layer is directly interfacing the third layer;
a current steering device disposed between the first layer and the second layer, wherein the fourth layer is disposed between the third layer and the current steering device;
    wherein the current steering device has a first impedance, wherein the fourth layer has a second impedance being between about 75% and about 125% of the first impedance.

2. The semiconductor device of claim 1, wherein the current steering device is one of a p-n junction diode, a p-i-n diode, or a transistor.

3. The semiconductor device of claim 1, wherein the second impedance is substantially equal to the first impedance.

4. The semiconductor device of claim 1, wherein the second impedance is between about 10 kΩ and about 10 MΩ.

5. The semiconductor device of claim 1, wherein the second impedance is between about 100 kΩ and about 1 MΩ.

6. The semiconductor device of claim 1, wherein at least one of the first layer or the second layer comprises a first conductive sub-layer and a second conductive sub-layer having a different composition than the first conductive sub-layer,
    wherein the second conductive sub-layer is disposed closer to the third layer than the first conductive sub-layer,
    wherein the first conductive sub-layer comprises one of tungsten, aluminum, or copper, and
    wherein the second conductive sub-layer comprises one of titanium, titanium nitride, or doped polysilicon.

7. The semiconductor device of claim 1, wherein the third layer comprises one of hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) or zirconium oxide ($Zr_xO_y$).

8. The semiconductor device of claim 7, wherein the third layer has a thickness of between about 20 and about 100 Angstroms.

9. The semiconductor device of claim 7, wherein the third layer has a thickness of between about 30 and about 50 Angstroms.

10. The semiconductor device of claim 1, wherein the fourth layer comprises a material selected from the group of titanium, tantalum, aluminum, zirconium, hafnium or silicon.

11. The semiconductor device of claim 1, wherein the fourth layer comprises a dopant.

12. The semiconductor device of claim 1, wherein the fourth layer comprises one of p-doped silicon or n-doped silicon.

13. The semiconductor device of claim 1, wherein the fourth layer comprises one of silicon nitride, tantalum nitride, hafnium nitride, or titanium nitride.

14. The semiconductor device of claim 1, wherein the fourth layer comprises silicon nitride.

15. The semiconductor device of claim 1, wherein the fourth layer comprises hafnium nitride.

16. The semiconductor device of claim 1, wherein the fourth layer comprises tantalum nitride.

17. The semiconductor device of claim 1, wherein the fourth layer comprises titanium nitride.

* * * * *